(12) United States Patent
Wu et al.

(10) Patent No.: US 9,447,497 B2
(45) Date of Patent: Sep. 20, 2016

(54) PROCESSING CHAMBER GAS DELIVERY SYSTEM WITH HOT-SWAPPABLE AMPOULE

(71) Applicants: Dien-Yeh Wu, San Jose, CA (US); Mark S. Johnson, San Jose, CA (US); David M. Santi, San Mateo, CA (US); Hyman Lam, San Jose, CA (US)

(72) Inventors: Dien-Yeh Wu, San Jose, CA (US); Mark S. Johnson, San Jose, CA (US); David M. Santi, San Mateo, CA (US); Hyman Lam, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 100 days.

(21) Appl. No.: 14/209,383

(22) Filed: Mar. 13, 2014

(65) Prior Publication Data

US 2014/0261733 A1 Sep. 18, 2014

Related U.S. Application Data

(60) Provisional application No. 61/780,783, filed on Mar. 13, 2013.

(51) Int. Cl.
*C23C 16/455* (2006.01)

(52) U.S. Cl.
CPC .... C23C 16/45561 (2013.01); *Y10T 137/0419* (2015.04); *Y10T 137/4259* (2015.04)

(58) Field of Classification Search
CPC ...................................................... B08B 5/00
USPC .................. 137/240, 334; 118/715, 724, 722
See application file for complete search history.

(56) References Cited

U.S. PATENT DOCUMENTS

| | | | |
|---|---|---|---|
| 6,174,371 B1 * | 1/2001 | Iseki | H01L 21/02 118/689 |
| 6,302,139 B1 * | 10/2001 | Dietz | B01D 53/0454 134/166 C |
| 6,432,205 B1 | 8/2002 | Lee et al. | |
| 7,748,400 B2 * | 7/2010 | Nakashima | C23C 16/4408 137/209 |
| 8,137,468 B2 * | 3/2012 | Choi | C23C 16/45561 118/724 |
| 9,032,990 B2 * | 5/2015 | Josephson | G05D 7/0641 118/715 |
| 2002/0066535 A1 * | 6/2002 | Brown | B01D 53/32 156/345.29 |
| 2004/0083962 A1 * | 5/2004 | Bang | C23C 16/4401 118/715 |
| 2005/0000428 A1 * | 1/2005 | Shero | C23C 16/4402 118/715 |
| 2005/0061245 A1 * | 3/2005 | Kim | C23C 16/20 118/715 |
| 2007/0235085 A1 | 10/2007 | Nakashima et al. | |
| 2008/0041311 A1 * | 2/2008 | Nakashima | C23C 16/4408 118/726 |
| 2008/0149031 A1 * | 6/2008 | Chu | C23C 16/4482 118/726 |
| 2009/0162551 A1 * | 6/2009 | Zilbauer | C23C 16/405 427/255.28 |
| 2009/0211525 A1 * | 8/2009 | Sarigiannis | C23C 16/4481 118/707 |
| 2009/0214778 A1 | 8/2009 | Sarigiannis et al. | |
| 2009/0232986 A1 * | 9/2009 | Choi | C23C 16/45561 427/255.28 |
| 2010/0136230 A1 * | 6/2010 | Moriya | C23C 16/4402 427/185 |
| 2010/0305884 A1 | 12/2010 | Yudovsky et al. | |
| 2013/0019960 A1 * | 1/2013 | Choi | C23C 16/4481 137/334 |
| 2014/0261733 A1 * | 9/2014 | Wu | C23C 16/45561 137/15.04 |

\* cited by examiner

*Primary Examiner* — Kevin Murphy
*Assistant Examiner* — Daniel P Donegan
(74) *Attorney, Agent, or Firm* — Servilla Whitney LLC

(57) ABSTRACT

Disclosed are apparatus and methods for supplying a constant flow of precursor gas to a processing chamber. The apparatus described, and methods of use, allow a precursor ampoule to be removed from the gas delivery system without interrupting the process.

11 Claims, 1 Drawing Sheet

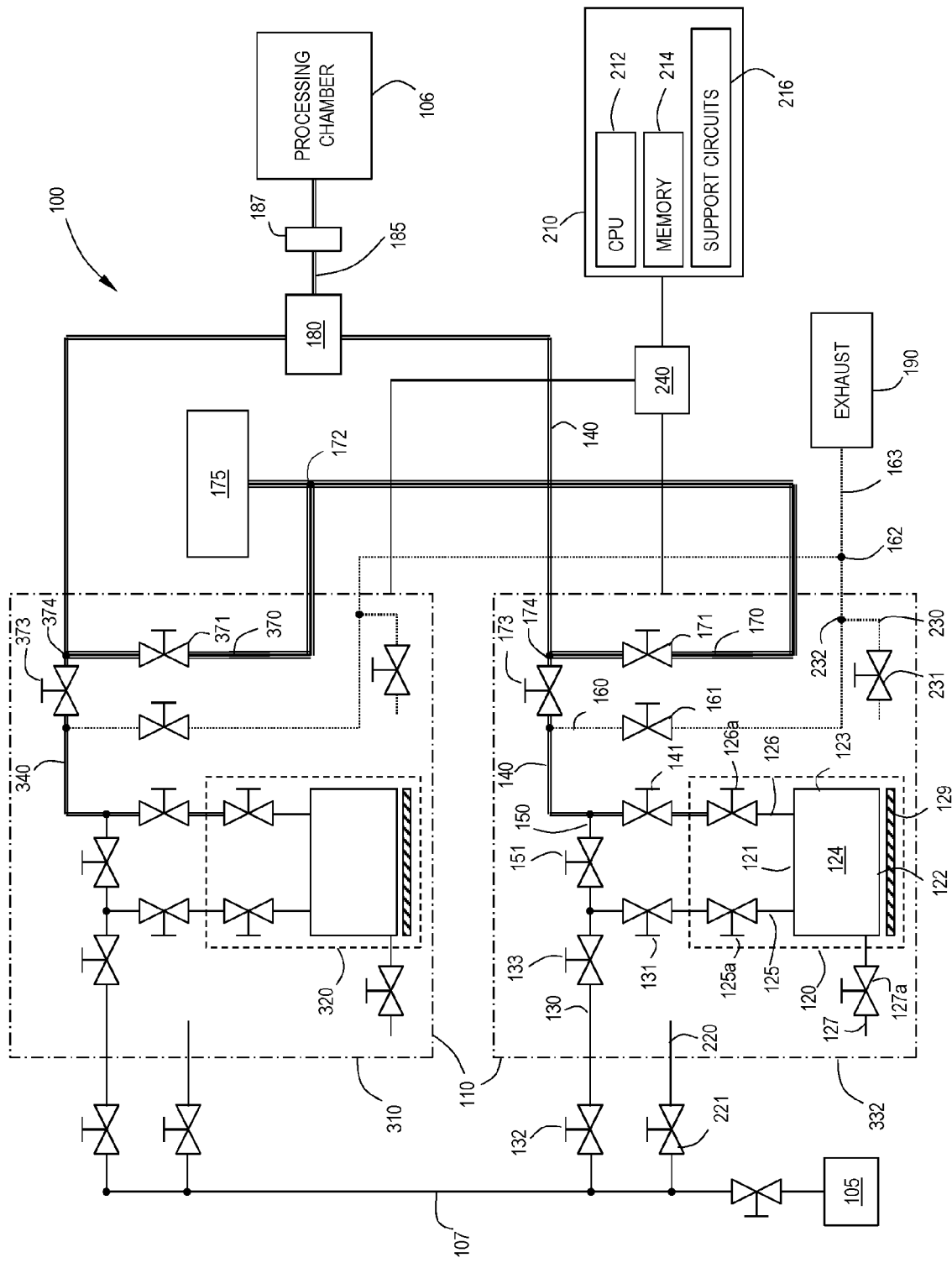

PROCESSING CHAMBER GAS DELIVERY SYSTEM WITH HOT-SWAPPABLE AMPOULE

CROSS-REFERENCE TO RELATED APPLICATIONS

This application claims the benefit of U.S. Provisional Application No. 61/780,783, filed Mar. 13, 2013.

BACKGROUND

The disclosure pertains to a gas delivery system for a processing chamber. More specifically, embodiments of the invention are directed to gas delivery systems with hot-swappable ampoules.

Many semiconductor processing techniques use precursors or reactants which have been stored/shipped in ampoules. These precursors or reactants can be gases, but are commonly solid or liquids. As many deposition processes, or etch processes, and the like, are gas phase interactions with a substrate surface, it is necessary to evaporate or sublimate the precursors or reactants.

For example, a typical solid precursor would be sublimated using a carrier or purge gas. The carrier gas is passed into an ampoule containing the solid precursor. The solid precursor sublimates and passes, with the carrier gas, and into a processing chamber. Once the level of precursor in the ampoule has decreased below a certain level, the ampoule must be changed to provide a fresh supply of precursor.

Changing ampoules during processing requires a significant amount of time and resources which decreases the productivity of the processing system. Typically, to change ampoules, (1) the process must be stopped, (2) the ampoule cooled, (3) the lines connecting the ampoule to the chamber purged, (4) the ampoule is replaced with a new ampoule, (5) a leak check is performed, (6) the lines are primed, (7) the ampoule is heated, and (8) the process is requalified. This entire procedure can take four to five hours to complete, resulting in a significant amount of downtime for the processing equipment. Additionally, with many current systems and reagents, a user must be careful when changing ampoules and opening the gas box doors because there is no exhaust and there could be a hazard from leaking chemicals.

Therefore, there is a need in the art for apparatus and methods of rapidly and safely changing precursor ampoules while minimizing the impact on the overall productivity.

SUMMARY

One or more embodiments of the invention are directed to gas delivery systems to deliver a gas to a processing chamber. The gas delivery system comprises at least two enclosures and a merge connector. Each of the at least two enclosures includes an inlet line, an outlet line, a bypass line, an exhaust line and a trickle purge line. The inlet line is in fluid communication with a carrier gas and has an ampoule inlet valve to control the flow of a carrier gas into an ampoule. The outlet line has an outlet valve to control flow of a precursor and carrier gas exiting an ampoule. The bypass line is downstream of the ampoule outlet valve and has a bypass valve. The bypass valve allows the carrier gas to flow from the inlet line to purge the outlet line without flowing carrier gas into an ampoule. The exhaust line is in fluid communication with the outlet line and downstream of the bypass line. The exhaust line has an exhaust valve to allow a gas flowing in the outlet line to flow to an exhaust. The trickle purge line is in fluid communication with the outlet line and downstream of the bypass line. The trickle purge line has a trickle purge valve to allow a flow of a trickle purge gas into the outlet line. The merge connector is downstream of the at least two enclosures and is in fluid communication with the outlet lines from each enclosure and merges a flow of gas in the outlet lines to a processing chamber inlet line.

In some embodiments, the trickle purge line is downstream of the exhaust line and in fluid communication with the outlet line. In one or more embodiments, the system further comprises a second trickle purge valve in fluid communication with the outlet line and positioned downstream of the exhaust line and upstream of the trickle purge line.

Some embodiments further comprise an exhaust merge connector downstream of the at least two enclosures and in fluid communication with the exhaust lines from each enclosure, the exhaust merge connector merging a flow of gas in the exhaust lines into a single exhaust line. One or more embodiments further comprise an enclosure purge line in fluid communication with the purge gas or carrier gas, the enclosure purge line providing a flow of gas into the enclosure. In some embodiments, the enclosure purge line is in fluid communication with the same carrier gas as the inlet line. Some embodiments further comprise an enclosure exhaust line in fluid communication with the exhaust line, the enclosure exhaust line exhausting gas within the enclosure. One or more embodiments further comprise an enclosure purge line and an enclosure exhaust line. The enclosure purge line is in fluid communication with the purge gas or carrier gas, the enclosure purge line providing a flow of gas into the enclosure. The enclosure exhaust line is in fluid communication with the exhaust line, the enclosure exhaust line exhausting gas within the enclosure.

In some embodiments, the trickle purge line of each enclosure is in fluid communication with a single trickle purge gas source. One or more embodiments further comprise an ampoule heater.

In some embodiments, the processing chamber inlet line is in fluid communication with a processing chamber. In one or more embodiments, each enclosure further comprises a safety interlock in communication with the processing chamber, the safety interlock shutting down the processing chamber if no gas is flowing through the outlet line.

Additional embodiments of the invention are directed to methods of delivery a gas to a processing chamber. A carrier gas is flowed through a first ampoule in a first enclosure to make a first precursor gas stream in a first outlet line. A second trickle purge gas is flowed through a second trickle purge line into a second enclosure. The second trickle purge line is in fluid communication with a second outlet line to make a second trickle purge stream in a second outlet line. The gas streams from the first outlet line and the second outlet line are mixed to make a processing gas.

Some embodiments further comprise flowing a carrier gas through a second ampoule in a second enclosure to make a second precursor gas stream in the second outlet line. The second precursor gas stream mixing with the second trickle purge stream in the second outlet line. Flowing a first trickle purge gas through a first trickle purge line into a first enclosure. The first trickle purge line in fluid communication with the first outlet, mixing with the first precursor gas stream in the first outlet line. The flow of the first precursor gas stream in the first outlet line is stopped so that only the first trickle purge gas is flowing in the first outlet line downstream of the first trickle purge gas line.

In some embodiments, stopping flow of the first precursor gas stream in the first outlet line further comprises allowing the first trickle purge gas to flow into both the first outlet line and into a first exhaust line upstream of the first trickle purge line and in fluid communication with the outlet line; and cutting off flow of the flow of the first trickle purge gas into the first exhaust line.

One or more embodiments further comprise stopping the flow of carrier gas into the first ampoule to isolate the first ampoule. Some embodiments further comprise replacing the first ampoule with a new ampoule in the enclosure.

Some embodiments further comprise flowing a first purge gas stream into the first enclosure and a second purge gas stream into the second enclosure. One or more embodiments further comprise exhausting gas from the first enclosure into a first exhaust line and exhausting gas from the second enclosure into a second exhaust line. Some embodiments further comprise flowing a first purge gas stream into the first enclosure and a second purge gas stream into the second enclosure, and exhausting gas from the first enclosure into a first exhaust line and exhausting gas from the second enclosure into a second exhaust line.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIG. 1 shows a schematic of a process gas delivery system in accordance with one or more embodiments of the invention.

DETAILED DESCRIPTION

Embodiments of the invention are directed to apparatus and methods to improve precursor delivery systems by providing the ability to switch precursor ampoules without needing to stop of the process. This allows for the processing chamber to be run while the ampoule is being changed without allowing contamination.

Embodiments of the invention can be used with solid precursors or liquids that are either used in a bubbler or vapor draw mode. In liquid delivery systems using higher vapor pressure precursors (e.g., $SiCl_4$, $TiCl_4$, TMA), stabilization of pressure in the ampoule may be important to ensure consistent repeatable dosing.

FIG. 1 shows a simplified schematic of a process gas delivery system 100 in accordance with one or more embodiments of the invention. The process gas delivery system 100 is suitable for producing a process gas containing a chemical precursor and generally includes a process chamber 106 and a carrier gas source 105 coupled to gas panel, the components of the latter being controlled by a controller. The gas panel generally controls the rate and pressure at which various process and carrier gases are delivered to process chamber. The process chamber may be a chamber to conduct vapor deposition processes or thermal processes containing a vaporized chemical precursor in liquid, gaseous or plasma state. Process chamber is generally a chemical vapor deposition (CVD) chamber, an atomic layer deposition (ALD) chamber, or a derivative thereof.

The process gas delivery system 100, also referred to as a fluid delivery circuit is generally intended to fluidly couple carrier gas source 105, ampoule 120, and process chamber 106 as necessary for operation of the process chamber 106. Carrier gas source 105 may be a local vessel, remote vessel or a centralized facility source that supplies the carrier gas throughout the facility (e.g., in-house gas supply). Carrier gas source 105 typically supplies a carrier gas such as nitrogen, hydrogen, argon, helium, or combinations thereof. Additional purge fluid sources (not shown) may also be fluidly coupled when the use of specialized purge fluids, such as a purge liquid, is required The system shown in FIG. 1 includes two enclosures 110 which are connected together as described herein. While two enclosures 110 are shown, there can be more enclosures which would allow more than one ampoule to be changed at the same time without stopping the processing. The components within the enclosures 110 are the same, except where identified.

The process gas delivery system 100 shows an ampoule 120 in dotted lines. While the ampoule 120 may be intended for use with the system 100, it is not a part of the system 100. The ampoule 120 has a top 121, bottom 122 and a body 123 defining an interior volume 124. The ampoule 120 includes an inlet 125 and an outlet 126 and may also include at least one additional conduit 127 in fluid communication with the interior volume 124 of the ampoule. The additional conduit 127 may include an isolation valve 127a and can be used to pressurize or depressurize the ampoule 120. The inlet 125 may include an inlet isolation valve 125a to isolate the inlet from the ambient environment when the ampoule is not connected. The outlet 126 may include an outlet isolation valve 126a to isolate the outlet from the ambient environment when the ampoule is not connected. After connecting the ampoule 120 to the generating system 100, the inlet isolation valve 125a and the outlet isolation valve 126a can be opened to allow fluid communication with the interior volume 124 of the ampoule 120.

The ampoule can contain any type of precursor suitable for use in the intended deposition process. In some embodiments, the ampoule 120 contains one or more of a solid precursor and a liquid precursor. The solid precursor or liquid precursor can be added to the ampoule by separating the top 121 from the body 123, or through the additional conduit 127. In one or more embodiments, the ampoule 120 comprises a solid precursor.

The system 100 includes an inlet line 130 in fluid communication with a carrier gas line 107 and/or a carrier gas source 105. The inlet line 130 has an ampoule inlet valve 131 to control the flow of the carrier gas into an ampoule 120, when an ampoule 120 is present. The system 100 also includes an outlet line 140 comprising an outlet valve 141 to control the flow of precursor vapor and carrier gas exiting the ampoule 120, when the ampoule 120 is present.

A bypass line 150 connects the inlet line 130 and the outlet line 140 to, as the name implies, bypass the ampoule 120. The bypass line 150 comprises a bypass valve 151 downstream of the ampoule outlet valve 126a, when an ampoule 120 is present. The bypass valve 151 allows carrier gas to flow from the inlet line 130 to purge the outlet line 140 without flowing carrier gas into the ampoule 120. For example, when there is no ampoule 120 present, the bypass valve 151 can be open to allow the flow of carrier gas. The bypass line 150 and bypass valve 151 of some embodiments are upstream of the ampoule inlet valve 131 (as shown). In one or more embodiments, the bypass line 150 connects to the inlet line 130 downstream of the ampoule inlet valve 131. In some embodiments, the bypass line 150 and bypass valve 151 are in communication with the outlet line 140 downstream of the ampoule outlet valve 141. In one or more embodiments, the bypass line 150 connects to the outlet line 140 upstream of the ampoule outlet valve 141. In some embodiments, the bypass line 150 connects to and is in fluid communication with the inlet line 130 upstream of the ampoule inlet valve 131 and connects to and is in fluid communication with the outlet line 140 downstream of the ampoule outlet valve 141. In one or more embodiments, the bypass line 150 connects to and is in fluid communication with the inlet line 130 downstream of the ampoule inlet valve 131 and connects to and is in fluid communication with the outlet line 140 upstream of the ampoule outlet valve 141.

An exhaust line 160 is in fluid communication with the outlet line 140. The exhaust line 160 shown connects to the outlet line 140 downstream of the bypass line 150, but could also connect upstream of the bypass line 150. The exhaust line 160 may include an exhaust valve 161 to allow gas flowing in the outlet line to flow to an exhaust 190. The exhaust valve 161 can be closed, open, or in an intermediate state, acting like a proportioning valve to control the percentage of the flow in the outlet line 140 that stays in the outlet line and the percentage of the flow that is sent to exhaust 190. In some embodiments, the exhaust line 160 from each enclosure 110 are combined in an exhaust merge connector 162 downstream of the enclosures 110. This allows multiple enclosures to be exhausted to the same exhaust system. The exhaust merge connector 162 can include a component, like a proportioning valve, that can adjust the percentage of gas flows from the first enclosure or the second enclosure before routing the gas to the exhaust system 190.

In some embodiments, the exhaust line 160 from each enclosure 110 merge to form a single exhaust line 160. FIG. 1 shows an exhaust merge connector 162 downstream of the at least two enclosures 110 and in fluid communication with the exhaust lines 160 from each enclosure 100. The exhaust merge connector 162 merges the flow of gas in the exhaust lines 160 into a single exhaust line 163 connected to the exhaust 190.

A trickle purge line 170 is in fluid communication with a purge gas or a purge gas source 175. In some embodiments, the trickle purge line 170 is downstream of the exhaust line 160 and in fluid communication with the outlet line 140. The trickle purge line 170 comprises a trickle purge valve 171 in fluid communication with the trickle purge line 170 to allow a flow of a purge gas to the processing chamber 106. In some embodiments, the flow of purge gas from the trickle purge line 170 mixes with the gas flowing in the outlet line 140. Generally, the purge gas is an inert gas which would merely act as a diluent for the gas already in the outlet line 140. As the name implies, the trickle purge line 170 can have a relatively constant but low rate flow of a purge gas. This constant flow can be to one or both (or more) of the enclosures 110 so that there is always at least a trickle of a flow of gas through the outlet line 140 of each enclosure 110. In some embodiments, there is a junction 172 downstream of the purge gas source 175. This junction splits the purge gas into trickle purge lines 170 with at least the same number of enclosures 110 exiting the junction. For example, if there are two enclosure 110, the junction 172 would split the purge gas flow into at least two trickle purge lines 170. One or more additional lines can extend from the junction 172 and be routed in whatever fashion desired.

A second trickle purge valve 173 may be positioned on the outlet line 140 between the exhaust line 160 and the trickle purge line 170. Stated differently, the second trickle purge valve 173 may be in fluid communication with the outlet line 140 and positioned downstream of the exhaust line 160 and upstream of the trickle purge line 170. Closing the second trickle purge valve 173 can result in several outcomes. If the exhaust line valve 161 is open, all of the flow of gas in the outlet line 140 would be diverted to the exhaust 190 (foreline) bypassing the processing chamber 106 and any flow in the trickle purge line 170 would flow directly to the merge connector 180 downstream of the enclosure 110.

In some embodiments, there is always a flow of gas through the trickle purge line 170 to each enclosure. The trickle purge flow can be sufficient to prevent backflow of gases into the ampoule 120 or enclosure 110 when an ampoule 120 is being removed. The amount of gas flowing from the trickle purge flow may or may not have a significant impact on the concentration of precursor entering the processing chamber 106.

A merge connector 180 is in fluid communication with the outlet line 140 downstream of each of the enclosures 110. The gas flowing through the outlet lines 140 of each enclosure 100 are merged before flowing to a processing chamber inlet line 185 and into a processing chamber 106. The merge connector 180 can be any suitable type of device capable of combining the gas flows from the outlet lines 140. The merge connector 180 can be, for example, a proportioning valve capable of selectively passing a gas flowing from one enclosure 110 over the other enclosure, or a mixture of flows from both enclosures. In some embodiments, the merge connector 180 can route the flow of gas directly to the exhaust 190.

A controller 210 includes central processing unit (CPU) 212, memory 214, and support circuits 216. Central processing unit 210 may be one of any form of computer processor that can be used in an industrial setting for controlling various chambers and sub-processors. Memory 214 is coupled to CPU 212 and may be one or more of readily available memory such as random access memory (RAM), read only memory (ROM), flash memory, compact disc, floppy disk, hard disk, or any other form of local or remote digital storage. Support circuits 216 are coupled to CPU 212 for supporting CPU 212 in a conventional manner. These circuits include cache, power supplies, clock circuits, input/output circuitry, subsystems, and the like.

In some embodiments, a flow controller 187 is disposed on the processing chamber inlet line 185 between the merge connector 180 and the processing chamber 106. The flow controller 187 may be adapted to modulate the flow rate of gas or other fluids through fluid delivery circuit. Flow controller 187 may be a proportional valve, a modulating valve, a needle valve, a regulator, a mass flow controller (MFC) or the like.

The inlet line 130 may include inlet valve 132 positioned between the carrier gas line 107 and the enclosure 110. The inlet line 130 may also include inlet valve 133 inside enclosure 110 and positioned upstream of the bypass line 150. Any of the valves, junctions and merge connectors can be remotely controllable, (e.g., remote shut-off valves). The valves of some embodiments are pneumatically or electronically controlled and the internal wetted surfaces thereof are fabricated from materials compatible with the process and other fluids handled by the fluid delivery circuit. Typically, the valves are actuated in response to a signal from a controller 210 to coordinate the delivery of gases through fluid delivery circuit. Sensors may be positioned throughout the fluid delivery circuit and are generally adapted to detect the temperature of a process, carrier, and/or purge fluid flowing through the lines, such as a thermocouple or flow sensor.

Ampoule assembly 120 may have a variety of sizes and geometries. Ampoule assembly may have a volume capacity of a chemical precursor within a range from about 0.5 L to about 10 L and more typically from about 1.2 L to about 4 L. In one example, ampoule assembly has a volume capacity of a chemical precursor of about 2.5 L. Chemical precursors that may be within ampoule assembly include liquid, solid and gaseous precursors, preferably in liquid or fluid-like states at predetermined temperatures and/or pressures. For example, a chemical precursor may exist in the solid state at room temperature, but melts to the liquid state upon being heated to a predetermined temperature within the ampoule. In another example, the majority of a chemical precursor may remain in the solid state in the ampoule, but is heated to an elevated temperature during processing such that a small amount of the solid precursor sublimates directly into vapor. In another example, a chemical precursor may exist in the gaseous state at ambient pressure, but condenses to the liquid state upon being pressurized to a predetermined pressure within the ampoule.

The enclosures 110 are containers suitable for enclosing the ampoule 120 and bypass line 150 and with access for the inlet line 130, outlet line 140, exhaust line 160 and trickle purge line 170. Generally the enclosure 110 has a door which can be closed and, possibly, locked. Should the ampoule, or one of the lines, have a small leak, hazardous buildup of gases could occur within the enclosure. To prevent this, some embodiments of the enclosure include a purge line 220 in fluid communication with the carrier gas line 107 or a purge line. The purge line could be a separate gas source or drawn off from the trickle purge source 175. The enclosure purge line 220 may include an enclosure purge valve 221 to meter the purge gas entering the enclosure 110. The purge gas can enter the enclosure through a wall of the enclosure. The purge gas does not enter any of the lines, but remains outside the system.

In some embodiments the enclosure 110 includes an enclosure exhaust line 230 with an optional enclosure exhaust valve 231. The enclosure exhaust line is in fluid communication with the exhaust 190 either by a separate conduit or through the exhaust line 160. In some embodiments, the enclosure exhaust line 230 merges with the exhaust line 160 at junction 232 which can be either inside the enclosure 110 or outside the enclosure 110. The gas delivery system of claim 1, further comprising an enclosure exhaust line in fluid communication with the exhaust line, the enclosure exhaust line exhausting gas within the enclosure.

The enclosure 110 can have one of the enclosure purge line 220 or enclosure exhaust line 230. However, it may be desirable to have both an enclosure purge line 220 and an enclosure exhaust line 230 so provide a steady flow of purge gas within the enclosure 110. This will effectively prevent the buildup of harmful chemicals in the enclosure 110 which could impact the operator who opens the enclosure 110.

Additionally, some embodiments include a safety interlock 240 which may be connected to the controller 210 and the enclosure 110. The safety interlock may include sensors to evaluate the atmosphere within the enclosure 110 or to evaluate the presence or absence of precursor exiting the ampoule 120, or other functions. If a predetermined condition is met (e.g., atmospheric contaminants above a certain level or opening of the enclosure door), the safety interlock could stop the process in the processing chamber or automatically switch the precursor source for the processing chamber to the other enclosure 110. For example, during a deposition process, the ampoule becomes low on precursor. An operator may change the ampoule to allow the process to continue uninterrupted, but forgets to switch the flow of precursor gas to the other enclosure. The safety interlock 240 can prevent the enclosure 110 door from opening, or, through the controller 210, switch the ampoule source to the other enclosure, if possible, or stop the process entirely.

During processing, in the first enclosure 110, a carrier gas flows from carrier gas source 105 through carrier gas line 107 to the inlet line 130 and into the ampoule 120 to make a first precursor gas stream in the outlet line 140. The carrier gas may be heated by a heater (not shown) to a desired temperature, or the ampoule 120 may be heated by a heater 129, or in some applications, both the carrier gas and ampoule assembly may be heated. During processing, bypass valve 151 of the first enclosure 110 is closed, directing all carrier gas flow through the ampoule 120 to the outlet line 140. The first precursor gas stream flows through the outlet line 140 past the exhaust line 160 with a closed or partially open exhaust valve 161. The first precursor gas stream flows through junction 174 to the merge connector 180. The trickle purge gas may be flowing through the trickle purge gas line 170 and through open trickle purge valve 171 to the junction 174 where it would mix with the first precursor gas stream in the outlet line 140 prior to the merge connector 180.

At the same time, in the second enclosure 310, a trickle purge gas is flowing through the second trickle purge line 370, through the second trickle purge valve 371 to the second outlet line 340 through second junction 374 to make a second trickle purge stream in the second outlet line 340. The second trickle purge stream flows through the second outlet line 340 to the merge connector 180.

In the merge connector 180, the gas streams from the first outlet line 140 and the second outlet line 340 mix to make a processing gas. In the initial condition described, the first precursor gas stream and the second trickle purge stream would be mixed to form the processing gas. The processing gas may then flow from the merge connector 180, through the processing chamber inlet line 185 and optionally flow controller 187 to the processing chamber 106.

When the first ampoule 120 is ready to be removed/changed, a carrier gas, from the same carrier gas source 105 or a different source, is flowed into the second enclosure 310. The carrier gas passes through the second ampoule 320 to make a second precursor gas stream in the second outlet line 340.

If the first trickle purge gas is not flowing into the first outlet line 140 already, then the flow is started. In some embodiments, the first trickle gas and the second trickle gas are always flowing to some extent through the junctions 174, 374 to the merge connector 180. Since the trickle purge gas is inert, a small amount will not adversely impact the processing.

Once the second precursor gas stream is flowing, the first precursor gas stream is stopped. This can be done by opening the first exhaust line valve 161 and closing the first second trickle purge valve 174. In this condition, the gas in the outlet line upstream of the exhaust line 160 will have no other path than to flow through the exhaust line 160. Another way of stopping the first precursor gas stream is to open the first bypass valve 151 while closing one or more of the first ampoule inlet valve 131 and the first ampoule outlet valve 141, or inlet valve 132, or by other combinations.

After stopping the flow of the first precursor gas, only the first trickle gas stream is flowing through the first outlet line 140 downstream of junction 174 to the merge connector 180 and the second precursor gas stream mixed with the second trickle gas stream are flowing through the second outlet line 340 downstream of the second junction 374 to the merge connector. The merge connector has received a constant flow of precursor gas streams and trickle purge gas streams without interruption, even though precursor gas flow was started in the second enclosure and stopped in the first enclosure.

In some embodiments, stopping of the first precursor gas stream in the first outlet line 140 may involve allowing some of the trickle purge gas to flow in the wrong direction (i.e., upstream). In embodiments of this sort, the carrier gas flow to the first ampoule 120 may be stopped by closing valves 131, 141 and opening bypass valve 151. The carrier gas flow through the bypass valve into the first outlet line 140 where it encounters the exhaust line 160. If the first exhaust valve 161 is opened, and there is sufficient negative pressure, all of the gas flowing through the bypass valve 151 would flow through the exhaust line 160 to exhaust 190. If the first second trickle purge valve 173 is open at this time, some of the trickle purge gas stream may flow in the wrong direction to the exhaust line 140. Doing this may allow the trickle purge gas stream to purge the first second trickle purge valve 173 which can then be closed preventing the first trickle purge gas stream from flowing upstream.

In some embodiments, the flow of the carrier gas into the first ampoule 120 is stopped to isolate the first ampoule 120. The first ampoule 120 can then be removed from the first enclosure 110 and be replaced or refilled. During an initial pump-purge procedure performed prior to removing and replacing the ampoule 120, valves 125a, 126a and/or valves 131,141 are closed. This isolates the ampoule 120 from the system. During a pump-down segment of a pump-purge procedure, carrier gas source 105 may also be isolated from fluid delivery circuit by closing valve 132.

After installation of a new ampoule 120, any fluid delivery connection points or other seals that were broken during ampoule removal/replacement are leak-checked. Leak checking ensures that contaminants are not drawn into the fluid delivery circuit and that toxic chemical precursors do not leak out of ampoule 120 during processing. The various lines, inlet, bypass and outlet, can then be purged with carrier gas flow either through the ampoule or not while the second ampoule is supplying precursor gas to the processing chamber. So, even though changing the ampoule is time consuming, While the foregoing is directed to embodiments of the present invention, other and further embodiments of the invention may be devised without departing from the basic scope thereof, and the scope thereof is determined by the claims that follow.

What is claimed is:

1. A gas delivery system to deliver a gas to a processing chamber, the gas delivery system comprising:
   at least two enclosures, each enclosure including:
      an inlet line in fluid communication with a carrier gas, the inlet line having an ampoule inlet valve to control the flow of a carrier gas into an ampoule,
      an outlet line having an outlet valve to control flow of a precursor and carrier gas exiting an ampoule,
      a bypass line downstream of the ampoule outlet valve having a bypass valve, the bypass valve allowing the carrier gas to flow from the inlet line to purge the outlet line without flowing carrier gas into an ampoule,
      an exhaust line in fluid communication with the outlet line and downstream of the bypass line, the exhaust line having an exhaust valve to allow a gas flowing in the outlet line to flow to an exhaust,
      a trickle purge line in fluid communication with the outlet line and downstream of the bypass line, the trickle purge line having a trickle purge valve to allow a flow of a trickle purge gas into the outlet line;
      an enclosure purge line in fluid communication with the purge gas or carrier gas, the enclosure purge line providing a flow of gas into the enclosure;
      an enclosure exhaust line in fluid communication with the exhaust line, the enclosure exhaust line exhausting gas within the enclosure; and
   a merge connector downstream of the at least two enclosures, the merge connector in fluid communication with the outlet lines from each enclosure and merging a flow of gas in the outlet lines to a processing chamber inlet line.

2. The gas delivery system of claim 1, wherein the trickle purge line is downstream of the exhaust line and in fluid communication with the outlet line.

3. The gas delivery system of claim 2, further comprising a second trickle purge valve in fluid communication with the outlet line and positioned downstream of the exhaust line and upstream of the trickle purge line.

4. The gas delivery system of claim 1, further comprising an exhaust merge connector downstream of the at least two enclosures and in fluid communication with the exhaust lines from each enclosure, the exhaust merge connector merging a flow of gas in the exhaust lines into a single exhaust line.

5. The gas delivery system of claim 1, further comprising an enclosure purge line in fluid communication with the purge gas or carrier gas, the enclosure purge line providing a flow of gas into the enclosure.

6. The gas delivery system of claim 5, wherein the enclosure purge line is in fluid communication with the same carrier gas as the inlet line.

7. The gas delivery system of claim 1, further comprising an enclosure exhaust line in fluid communication with the exhaust line, the enclosure exhaust line exhausting gas within the enclosure.

8. The gas delivery system of claim 1, wherein the trickle purge line of each enclosure is in fluid communication with a single trickle purge gas source.

9. The gas delivery system of claim 1, further comprising an ampoule heater.

10. The gas delivery system of claim 1, wherein the processing chamber inlet line is in fluid communication with a processing chamber.

11. The gas delivery system of claim 10, wherein each enclosure further comprises a safety interlock in communication with the processing chamber, the safety interlock shutting down the processing chamber if no gas is flowing through the outlet line.

* * * * *